United States Patent [19]
Mole et al.

[11] Patent Number: 6,060,956
[45] Date of Patent: May 9, 2000

[54] VARIABLE CAPACITANCE CIRCUIT

[75] Inventors: Peter John Mole, St Albans; Gregory Weng Mun Yuen, Harlow, both of United Kingdom

[73] Assignee: Nortel Networks Corporation, Montreal, Canada

[21] Appl. No.: 09/100,488

[22] Filed: Jun. 19, 1998

[51] Int. Cl.[7] ..................................................... H03B 5/08
[52] U.S. Cl. .............................. 331/117 R; 331/177 R; 330/252; 334/11
[58] Field of Search ........................ 331/117 R, 117 FE, 331/177 R, 177 V; 330/292, 252, 257, 254; 334/11, 15, 78

[56] References Cited

U.S. PATENT DOCUMENTS

| | | | |
|---|---|---|---|
| 2,980,768 | 4/1961 | Ehret | 179/100.2 |
| 3,832,656 | 8/1974 | Ito et al. | 334/14 |
| 4,267,518 | 5/1981 | Davis | 330/254 |
| 5,331,478 | 7/1994 | Aranovsky | 330/252 |
| 5,510,755 | 4/1996 | Kodrnja et al. | |
| 5,856,763 | 1/1999 | Reeser et al. | 331/49 |

FOREIGN PATENT DOCUMENTS

| | | |
|---|---|---|
| 3629476 | 3/1988 | Germany . |
| 2288502 | 10/1995 | United Kingdom . |

OTHER PUBLICATIONS

Wei–Zen Chen and Jieh–Tsorng Wu, "A 2 V 2 Ghz BJT Variable–Frequency Oscillator" Proceedings of the 1997 Bipolar/BiCMOS circuits and Technology Meeting. Pp61–63.

Nhat M Nguyen and Robert G Meyer, "A 1.8 GHz Monolithic LC Voltage–Controlled Oscillator", IEEE Journal of Solid–State circuits, vol. 27, No. 3, pp. 444–450, Mar. 1992.

*Primary Examiner*—Benny Lee
*Assistant Examiner*—Henry Choe
*Attorney, Agent, or Firm*—Lee, Mann, Smith, McWilliams, Sweeney & Ohlson

[57] ABSTRACT

The invention provides an improved variable capacitance circuit which is substantially linearly controlled using voltage or current control. The circuit comprises two emitter connector transistors and a constant current source or drain forming a current steering circuit. A fixed capacitor is connected to the emitters of the transistors forming a port into the circuit. AC current into the port flows through the fixed capacitor and is fed back through the transistors in a proportion depending on the voltage at their bases. The effective capacitance of the circuit is varied using this variable AC feedback arrangement. Other embodiments use current control to vary the circuit capacitance by varying the effective constant current source level.

21 Claims, 7 Drawing Sheets

VARIABLE CAPACITANCE CIRCUIT

FIELD OF THE INVENTION

The invention relates to a variable AC capacitance circuit, with particular but not exclusive application to high frequency oscillator tuning for wireless communications applications.

PRIOR ART

Voltage controlled oscillators (VCO) are often used in phase lock loop circuits to generate a signal within a well defined frequency band. Often this frequency band is changeable for example in wireless systems where well defined and stable carrier frequencies are required over one of a number of frequency channels. The channels changing according to the protocols adopted by the system. As use of the wireless frequency spectrum is limited and tightly regulated, a low noise and well controlled VCO is required for such applications.

Voltage controlled variable capacitance diodes are often used in the resonant circuit of a voltage controlled oscillator (VCO). Varying the voltage developed across such a diode varies its capacitance and hence varies the resonant frequency of the resonant circuit. The capacitance of such a diode does not vary linearly with voltage, and hence the frequency oscillation of a VCO regulated in this manner by such a diode varies non-linearly with voltage applied to that diode. Such non-linearity can be a problem, for instance if the VCO is being employed in a feedback loop for which critical damping is a requirement.

GB2288502 discloses a variable capacitance circuit utilising a number of transistors and fixed capacitors. The arrangement multiplies the capacitance by the gain of an amplifier. Since the gain can be varied by setting the operating current, the capacitance can also be varied. The capacitive current I1 is sampled in a resistor R1—(see FIG. 2 of GB2288502) and the voltage developed across R1 is amplified by T1. This process however is very noisy.

DE3629476 discloses a transistor in shunt across a capacitor. The shunting effect can be varied in a graded manner, however this arrangement is also noisy and its linearity is not well controlled.

U.S. Pat. No. 5,5107,55 discloses a voltage controlled capacitor circuit utilising a number of transistors, fixed capacitors and resistors. Capacitive currents IC are sampled in diodes D1 and converted to voltage V2. This is converted back to current IC in Q7 and Q8. Again this process is noisy. The arrangement also requires phase compensation circuitry—Q9, Q10, CC, I4 and I5 which also introduces noise. The circuit as a whole requires a relatively high supply voltage to drive all the devices of the circuit across the supply.

OBJECT OF THE INVENTION

It is an object of the present invention to provide an improved variable AC capacitance circuit.

SUMMARY OF THE INVENTION

In a first aspect of the present invention there is provided a variable AC capacitance circuit comprising:
- a first and a second AC current control means connected together;
- a fixed capacitor connected between a first AC port and said means connection;
- wherein said second means is connected between said capacitor and a second AC port;
- the circuit arranged such that AC current flowing through said fixed capacitor is divided through said first and second means, and wherein the proportion of AC current flowing through each said means is varied in order to vary the net AC current flowing between said first and said second AC ports.

Preferably said fixed capacitor is connected across said first AC current control means such that current flowing therethrough at least partially cancels AC current flowing through said fixed capacitor Alternatively, said second AC port is connected to the DC supply.

Preferably said first and second AC current control means comprise:
- a first and second transistor having emitters connected together;
- said second transistor having a collector connected to said second AC port; and
- a DC current source connected to said emitter connection;
- wherein the voltage difference between the bases of said first and second transistors is varied in order to vary the proportion of AC current flowing through each said transistor.

For the purposes of this specification, the terms emitter, collector and base include the equivalent source, drain, and gate connections respectively of FET type transistors.

Alternatively, said first and second AC current control means comprise:
- a first and second transistor; said second transistor having a collector connected to said second AC port;
- a degeneration resistor and a bypass capacitor connected in parallel between the emitter of said first and second transistor; a first and a second DC current source connected respectively to the emitters of said first and second transistor;
- wherein the voltage difference between the bases of said first and second transistors is varied in order to vary the proportion of AC current flowing through each said transistor.

Alternatively the base voltage difference is fixed and the first and second DC current sources are varied in order to vary the proportion of AC current flowing through each said transistor.

Preferably the first and second DC current sources comprise a differential current mirror.

In a second aspect of the present invention there is provided a variable AC capacitance circuit comprising:
- a first and a second AC current control means connected together;
- a first fixed capacitor connected between a first AC port and said first and second means connection;
- wherein said second means is connected between said capacitor and a second AC port;
- a third and a fourth AC current control means connected together;
- a second fixed capacitor connected between said second AC port and said third and fourth means connection;
- wherein said third means is connected between said second fixed capacitor and said first AC port;
- the circuit arranged such that part of the AC current flowing through said first fixed capacitor AC port is divided through said first and second means and such that AC current flowing through said second fixed capacitor is divided through said third and fourth means, and wherein the proportion of AC current flowing through each said means is varied in order to vary the net AC current flowing between said first and second AC ports.

In a further inventive aspect of the present invention there is provided a voltage controlled oscillator comprising a variable AC capacitance circuit comprising:

a first and a second AC current control means connected together;

a fixed capacitor connected between a first AC port and said means connection;

wherein said second means is connected between said capacitor and a second AC port;

the circuit arranged such that AC current flowing through said fixed capacitor is divided through said first and second means, and wherein the proportion of AC current flowing through each said means is varied in order to vary the net AC current flowing between said first and said second AC ports.

In a further inventive aspect of the present invention there is provided a voltage controlled oscillator comprising a variable AC capacitance circuit comprising:

a first and a second AC current control means connected together;

a first fixed capacitor connected between a first AC port and said first and second means connection;

wherein said second means is connected between said capacitor and a second AC port;

a third and a fourth AC current control means connected together;

a second fixed capacitor connected between said second AC port and said third and fourth means connection;

wherein said third means is connected between said second fixed capacitor and said first AC port;

the circuit arranged such that part of the AC current flowing through said first fixed capacitor AC port is divided through said first and second means and such that AC current flowing through said second fixed capacitor is divided through said third and fourth means, and wherein the proportion of AC current flowing through each said means is varied in order to vary the net AC current flowing between said first and second AC ports.

DESCRIPTION OF THE DRAWINGS

In order that a greater understanding of the invention can be obtained, embodiments of the invention will now be described with reference to the accompanying drawings, by way of example only and without intending to be limiting, in which.

DETAILED DESCRIPTION

Figure 1:
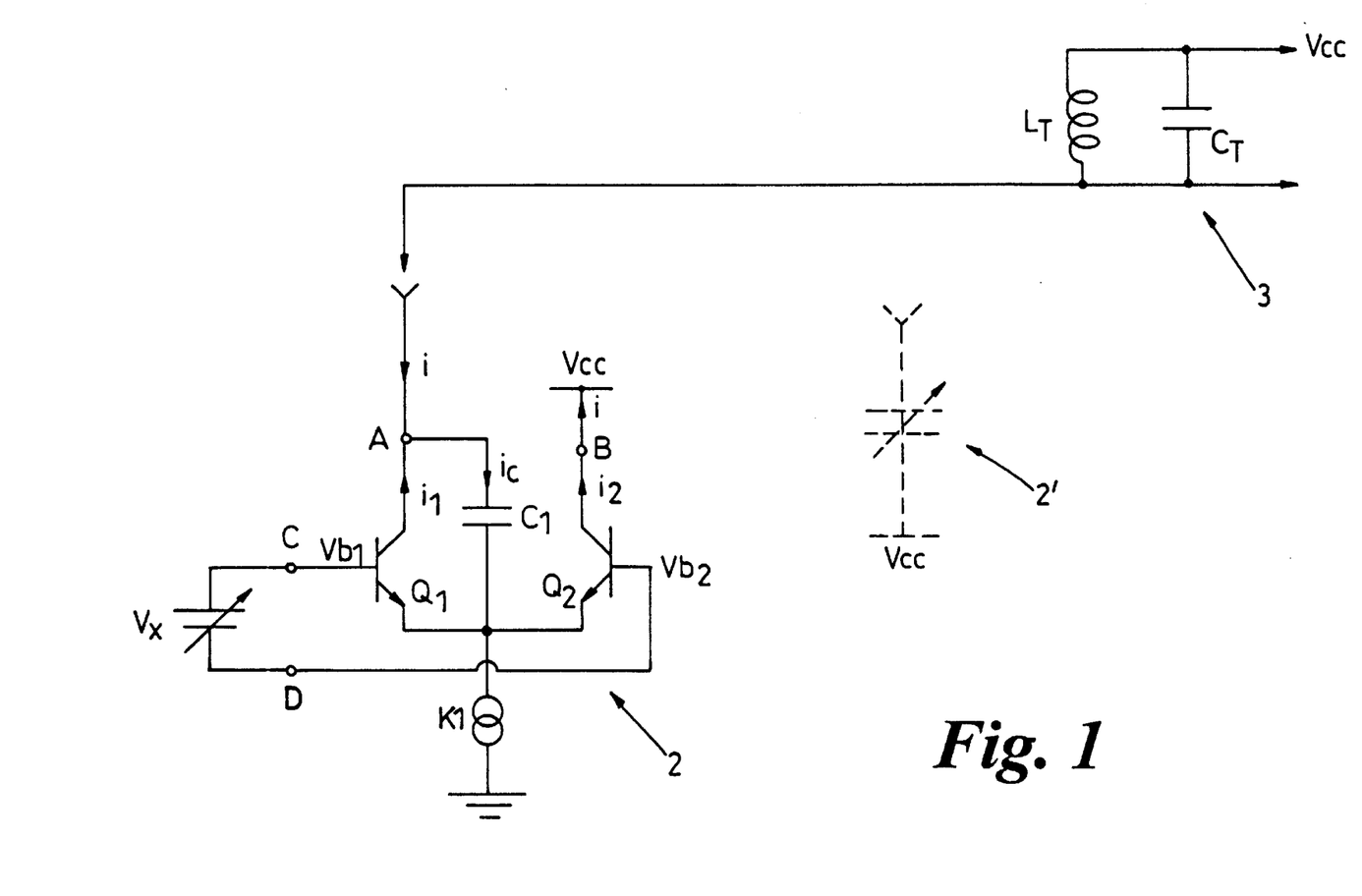
FIG. 1 shows a first embodiment variable capacitance circuit of the invention.

Referring to FIG. 1 a variable capacitance circuit 2 is thereshown connected to a tuned circuit 3. The variable capacitance circuit 2 comprises: two transistors Q1 and Q2; a constant current source K1; and a fixed capacitor C1.

The transistors Q1 and Q2 have their emitters connected together and in turn to the current source K1 to form a current steering circuit making up first and second AC current control means. The capacitor C1 is connected between the emitters of the transistors Q1 and Q2 and the collector of one of the transistors Q1, the collector connection forming a port A to which the tuned circuit 3 is connected. The bases of the transistors Q1 and Q2 are connected at ports C and D to a variable voltage source $V_x$.

NPN or PNP type transistors are preferably used, the constant current source K1 being replaced with a constant current source of opposite polarity as appropriate. Other transistor types such as FETs could alternatively be used.

The constant current source K1 maintains a constant current flow such that with appropriate and equal bias voltage (VB1=VB2) applied at the bases of the transistors Q1 and Q2, the currents flowing through each transistor Q1 and Q2 will be equal. As VB1 is increased and VB2 reduced, transistor Q2 eventually turns off leaving all the current to flow through transistor Q1; and vice versa.

Alternatively, a resistor could be used in place of the constant current source K1. Current steering action remains determined by the differential base voltages whereupon Vb1 and Vb2 sets the absolute value of the current.

Capacitive current ic entering the variable capacitance circuit 2 at port A flows through the fixed capacitor C1 and is injected at the emitter connection of transistor Q1 and Q2. The presence of the constant current source K1 forces the capacitive current ic to flow back into the emitters of the transistors Q1 and Q2. If the transistors Q1 and Q2 are equally biased, equal amounts of capacitive current ic will flow through each $$\left(i_1 = i_2 = \frac{ic}{2}\right).$$

Current $i_1$ flowing through transistor Q1 is out of phase and half the value of the capacitive current ic which cancels half the capacitive current $$\frac{ic}{2}.$$

Similarly, half the capacitive current $i_2$ flows through transistor Q2 to port B. The tuned circuit therefore sees half capacitance C1 across ports A and $$B\left(I = \frac{ic}{2}\right).$$

If transistor Q2 is biased off then all the capacitive current $i_1$ will flow back through Q1 effectively cancelling the capacitive current ic flowing through the capacitor C1 at port A. In this case the tuned circuit 3 will see no additional capacitive current I and hence no additional capacitance. In the opposite case, when Q1 is biased off and Q2 is biased fully on, there is no capacitive current through Q1 to cancel or partially cancel the current ic through the capacitor C1, so that the full capacitive current $i_2$=ic flows from port A through transistor Q2 emitter (an effective AC ground) to port B which is connected to the DC supply Vcc. In this case the tuned circuit sees the full capacitance C1 across the variable capacitance circuit 2.

As the variable voltage source Vx varies VB1 and VB2 between these two extreme positions, the effective capacitance of the circuit 2 varies in a well defined controlled manner between 0 and C1, such that it can be linearised if desired.

The effective capacitance 2' of the variable capacitance circuit 2 is shown in phantom outline. The variable capacitance circuit 2 could be arranged within the tuned circuit 3 in other configurations as are known in the art.

The value of C1 is sufficiently small such that its reactance at the frequencies of operation is much larger than the resistance seen at the emitters of transistors Q1 and Q2. This feature reduces the phase shifting error of the current injected into the emitters, and hence eliminates the need for phase compensating circuitry as used in some prior art arrangements.

The variable capacitance circuit 2 preferably provides variable capacitance in the 10MHz to 10GHz frequency range.

The inventive arrangement effectively feeds back capacitive current ic flowing through the capacitor C1 through transistor Q1 to cancel the capacitive current ic and transistor Q2 to pass the capacitive current ic between ports A and B. The net capacitance 2' between ports A and B is controlled by varying the proportion of current ic flowing through Q1 and Q2. This in turn is achieved by varying the differential voltage Vx between the bases of the transistors Q1 and Q2. This arrangement provides a more direct signal path than prior arrangements (using only one capacitor and one transistor Q1 or Q2 without the need for phase compensation circuitry) which in turn provides better high frequency performance especially in terms of noise reduction. The inventive arrangement also reduces the number of devices across the power supply which allows lower voltage operation and reduced power consumption. Furthermore, the inventive arrangement provides a well controlled change in capacitance with changes in the voltage differential Vx between the bases of the two transistors Q1 and Q2. Prior art capacitance changes with voltage are not well controlled.

Figure 8:
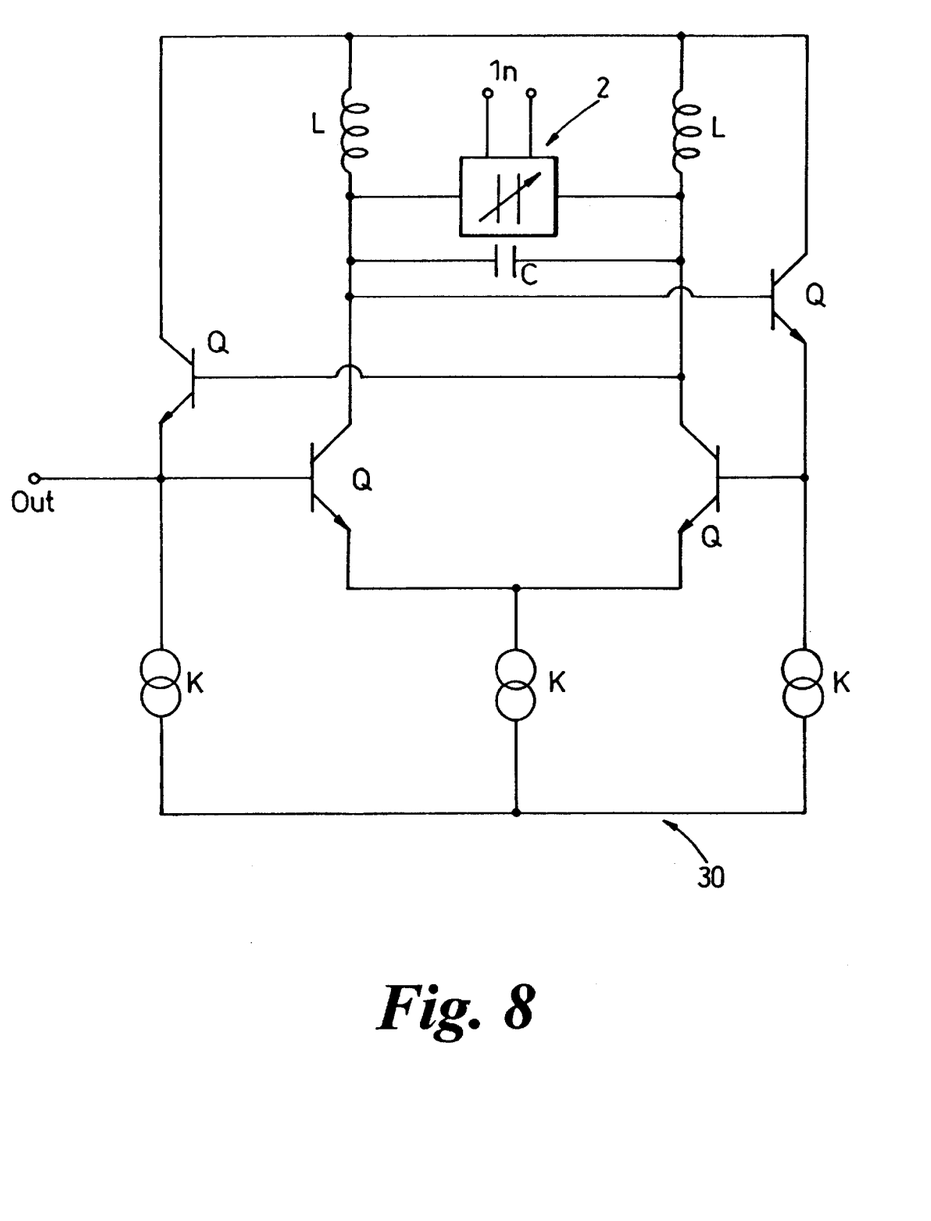
FIG. 8 shows a voltage controlled oscillator incorporating a variable capacitance circuit of the invention.
Figure 9:
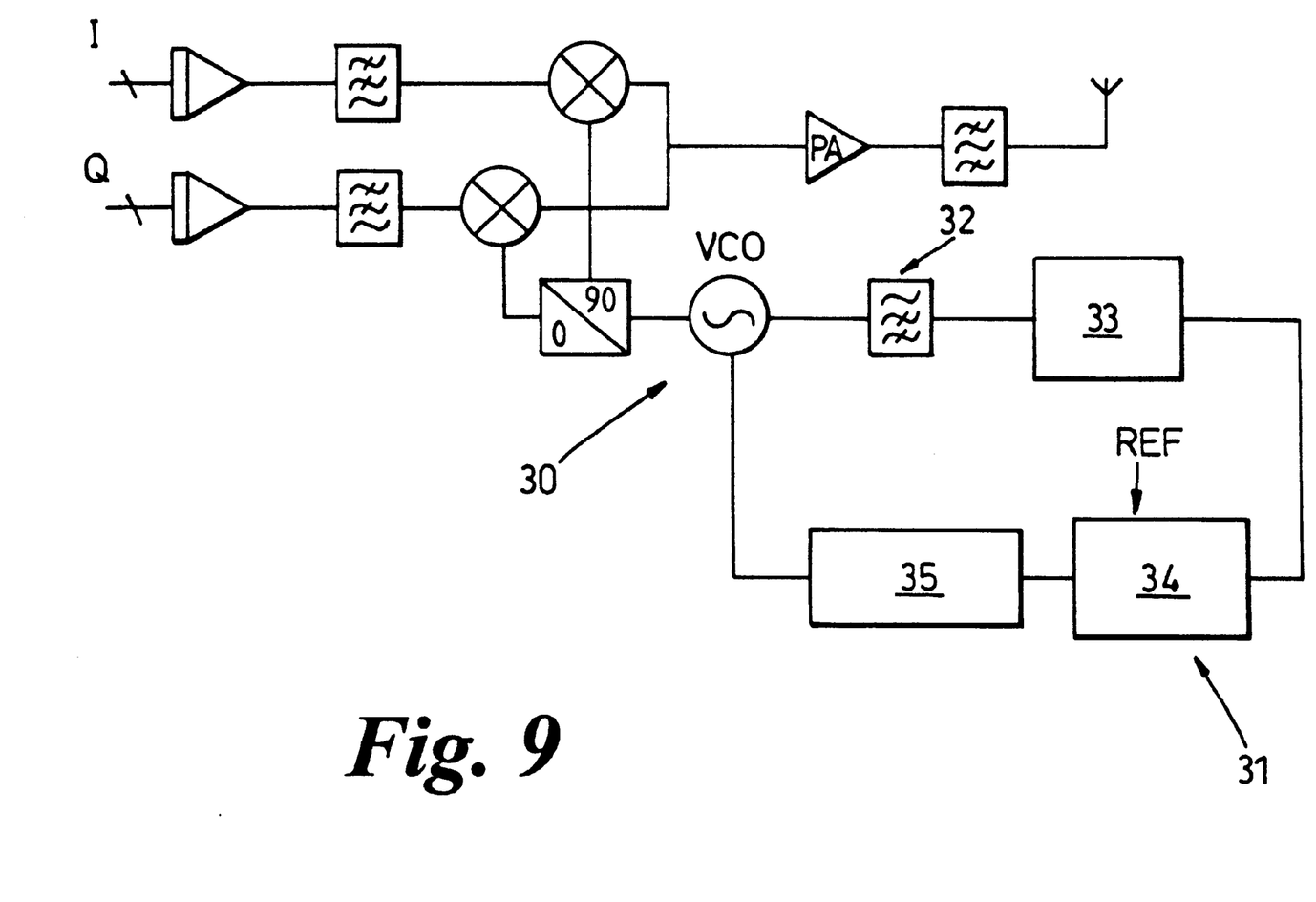
FIG. 9 shows a block schematic diagram of the carrier frequency generation and modulation stage of a wireless communications system.

Low noise and well defined frequency bands are especially important within wireless applications where use of the frequency spectrum is limited and highly regulated. For example the variable capacitance circuit of the invention can be incorporated within a VCO (as shown in FIG. 8) to provide a low noise and well defined frequency source. This in turn might be used (as shown in FIG. 9) to generate the carrier frequency in a wireless system, this frequency usually being rapidly changeable to define changing frequency bands of operation of the system.

Figure 2:
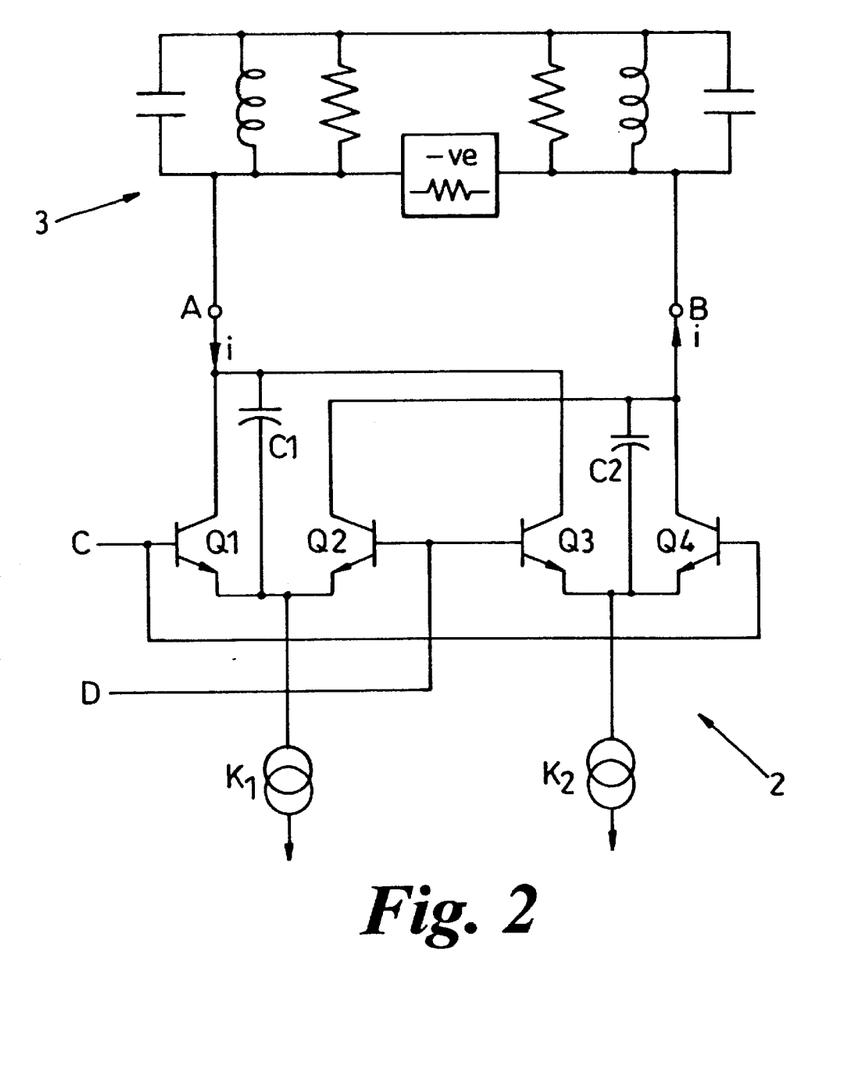
FIG. 2 shows a second embodiment variable capacitance circuit.

FIG. 2 shows a second embodiment variable capacitance circuit 2 which comprises four transistors Q1, Q2, Q3 and Q4; two constant current sources K1 and K2; and two fixed capacitors C1 and C2.

Transistors Q1 and Q2 have their emitters connected together and to constant current source K1. Capacitor C1 is connected between the emitter and collector of transistor Q1, the collector connection forming port A. Transistors Q3 and Q4 have their emitters connected together and to constant current source K2. Capacitor C2 is connected between the emitter and collector of transistor Q4, the collector connection forming port B. Port B is also connected to the collector of transistor Q2, and port A to the collector of transistor Q3; the arrangement forming a symmetrical pair of current steering circuits. The bases of transistors Q1 and Q4 are connected to port C, and the bases of transistors Q2 and Q3 are connected to port D.

Ports C and D are connected across a variable voltage source (not shown) and ports A and B are connected across a tuned circuit arrangement 3; the variable capacitance circuit 2 effectively forming two variable capacitors (C1' and C2') connected as shown in phantom outline as effective variable capacitance circuit 2'.

Preferably but not essentially capacitors C1 and C2 are equal and have values such that their reactances at the frequencies of operation are significantly larger than the impedance as seen at the emitters of the transistors Q1, Q2, Q3, Q4.

The current steering operation of this circuit 2 is similar to that of the first embodiment in FIG. 1 in that the capacitive currents ic flowing through capacitors C1 and C2 are steered in varying proportions through transistors Q1 and Q2, and Q3 and Q4 respectively by varying the voltage at ports C and D. Capacitive current flowing back through transistors Q1 and Q4 effectively cancels a portion or all of the capacitive currents through C1 and C2 respectively. Capacitive current flowing back through transistors Q2 and Q3 passes from ports A to B to provide a net capacitive current I which the tuned circuit 3 sees as an effective capacitance 2'.

Figure 3:
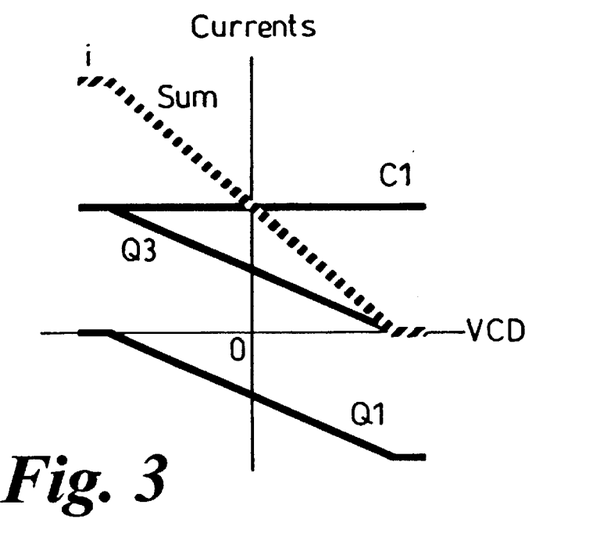
FIG. 3 is a plot of the current at port A of FIGS. 2.

FIG. 3 shows the currents in capacitor C1, transistors Q1 and Q3, and the sum or net capacitive current i seen at port A. To the left of the graph, Q1 is fully off and Q3 fully on. At this point, no cancelling current flows through transistor Q1, however in addition to the current through capacitor C1 which then flows through transistor Q2 to port B, a further in-phase current also flows through transistor Q3 and capacitor C2 to port B. This adds to the current through capacitor C1 and effectively doubles (C1+C2=2C where C=C1=C2) the total capacitive current I so that two capacitors C1' and C2' are seen in parallel between ports A and B.

To the right of the graph, transistor Q1 is shown fully on and transistor Q3 fully off. At this point, all the capacitive current through capacitor C1 flows back through transistor Q1 which fully cancels the capacitive current flowing through capacitor C1, so that no net capacitance current flows between and hence no capacitance is seen across ports A and B. Similarly, with transistor Q4 fully on and transistor Q3 fully off, no capacitance is seen across ports A and B from this part of the circuit.

As the voltage across ports C and D is varied between these two extreme cases, the net capacitive current I through port A can be seen varying from twice that of capacitors C1 or C2 to 0. Given that C1=C2=C, the effective capacitance between ports A and B can be varied between 2C and 0.

This embodiment is more balanced than that of FIG. 1, which helps to reduce even order harmonies.

Figure 4:
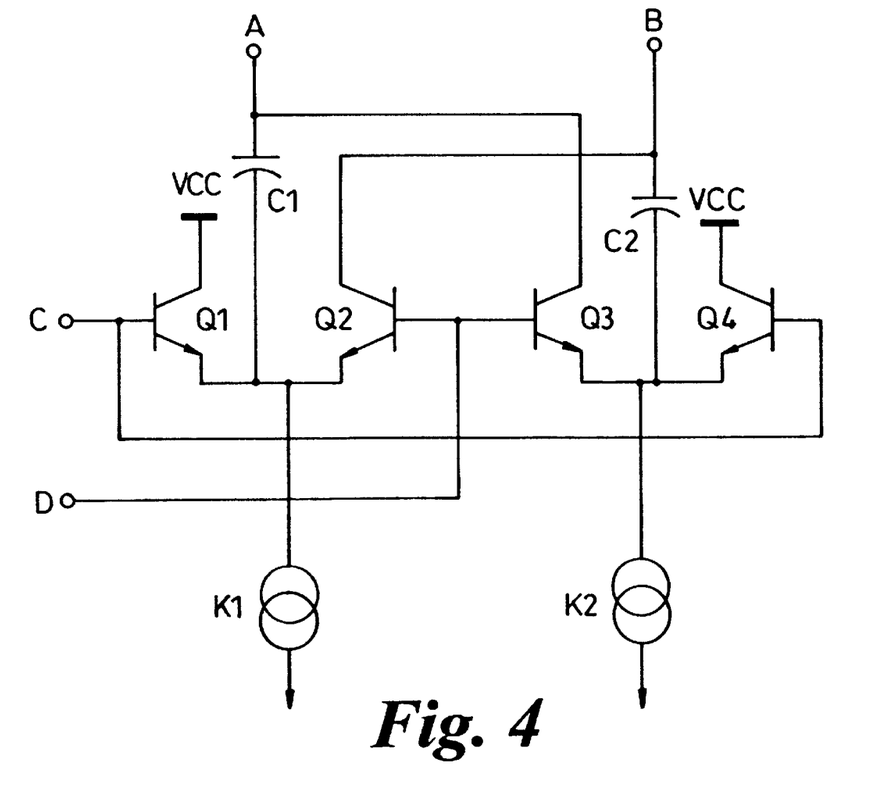
FIG. 4 is a third embodiment variable capacitance circuit.

FIG. 4 shows a further embodiment similar to that of FIG. 2 but where the collectors of transistors Q1 and Q4 are returned directly to the positive supply VCC (an effective AC ground) such that no cancelling of the capacitive currents through capacitors C1 and C2 can occur. The other components of the circuit are the same as those of the second embodiment shown in FIG. 2. In this embodiment ports A and B are formed at respectively the connections between capacitor C1 and the collector of transistor Q3, and capacitor C2 and the collector of transistor Q2. The tuning range of this variable capacitance circuit 2 is C to 2C, where C=C1=

C2. In practical non-ideal circuits, a tuning range extending to 0 is unlikely to be readily achievable. In any case most circuits will require a minimum finite capacitance rather than 0.

When VCD is greater than 100 mV; transistors Q1 and Q4 are biased on and Q2 and Q3 are biased off. Port A only sees capacitive current through capacitor C1. Hence, the effective capacitance is C1. Similarly, port B sees an effective capacitance of C2. When VCD=0; all the transistors are biased on equally. Port A sees three currents, through C1 Q1 collector and Q3 collector. Q1 collector current is half the amplitude and out-of-phase with the current through capacitor C1. Q3 collector current is half the amplitude of the current through C2 and is in-phase with the current than C1. Hence, the effective capacitance is $$\frac{C1}{2} + \frac{C2}{2} = C1$$

(where C1=C2). Similarly port B sees C2. When VCD is less than −100 mV; transistors Q1 and Q4 are biased off, and Q3 and Q2 are biased on. Port A sees two currents through capacitor C3 and transistor Q3. The currents are equal and in-phase. Hence, the effective capacitance is C1+C2 or 2C if C1=C2. Similarly, node B sees C2+C1=2C.

Figure 5:
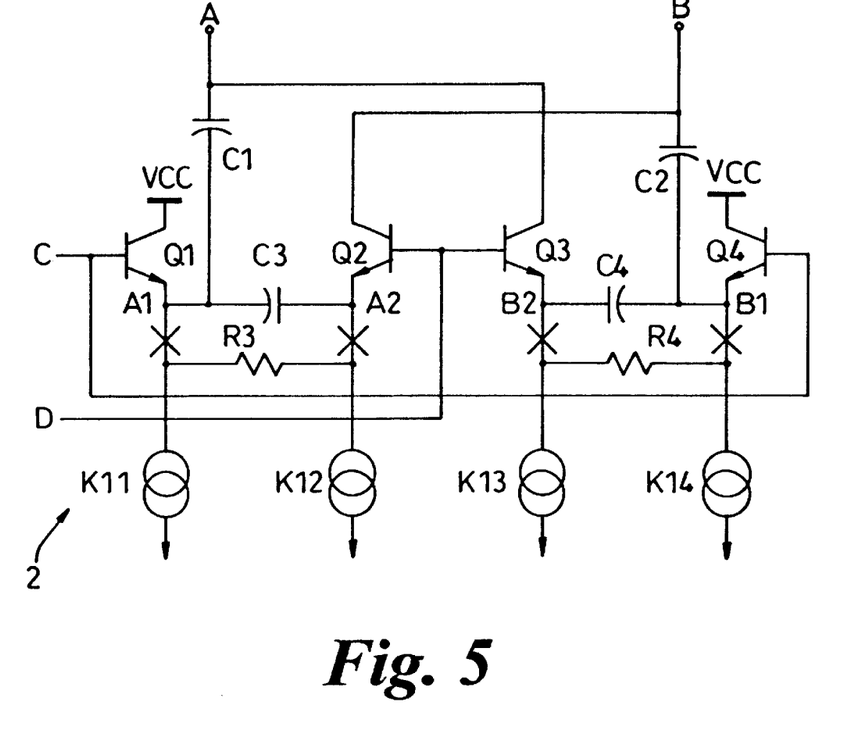
FIG. 5 is a fourth and preferred embodiment variable capacitance circuit.

FIG. 5 shows a further and preferred embodiment similar to that of FIG. 4 which uses degenerated emitters which expand the otherwise limited voltage range (−100 mV<VCD<100 mV) usable across ports C and D. This reduces the effects of noise which might otherwise adversely effect the current steering of the capacitive currents by the transistors Q1, Q2, Q3, Q4.

Constant current sources K11, K12, K13, K14 are each connected to a transistor emitter, respectively Q1, Q2, Q3, Q4. The constant current sources are of equal value and are half the value of the current sources in the previous embodiments, such that K10=K12=K13=K14=0.5K1= 0.5K2 and such that the transistors are maintained in the same DC operating range. DC degeneration resistor R3 is connected between transistor emitters Q1 and Q2, and degeneration resistor R4 is connected between transistor emitters Q3 and Q4. The value of R3 and R4 determine the expansion of the VCD voltage range in known manner. Preferably R3 equals R4.

Bypass capacitors C3 and C4 are connected in parallel with R3 and R4 respectively to ensure the same low AC resistance path between the transistor emitters as before. Preferably the bypass capacitors C3 and C4 are equal and large. Capacitors C1 and C2 can be connected to the transistor emitter on either side of bypass capacitors C3 and C4 respectively, without effecting operation of the circuit 2.

The degenerated emitter technique can also be used on the other embodiments of the invention shown in FIGS. 1 and 2.

Figure 6:
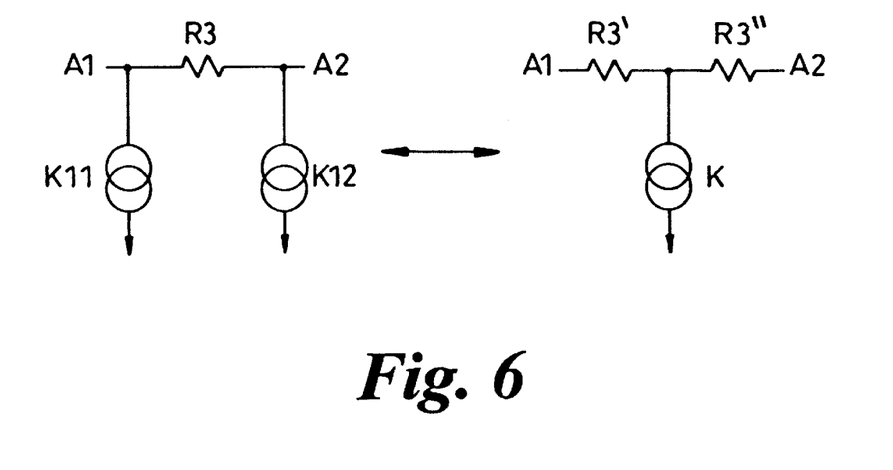
FIG. 6 is an equivalent biasing circuit.

As a further alternative, the degenerated emitters arrangement of FIG. 5 which is connected at points A1 and A2 or B1 and B2 as shown in FIG. 5, can be replaced by an equivalent arrangement shown in FIG. 6. The equivalent circuit uses a single current source K for each pair of current sources K11 and K12 or K13 and K14. Each current source is connected to two DC degeneration resistors (R3' and R3" or R4' and R4") which in turn are connected to the transistor emitters Q1 and Q2 or Q3 and Q4. The current source K is equal in value to that of K11 and K12 or K13 and K14 combined, and the two resistors (R3' and R3" or R4' and R4") are half the value of R3 or R4.

Figure 7:
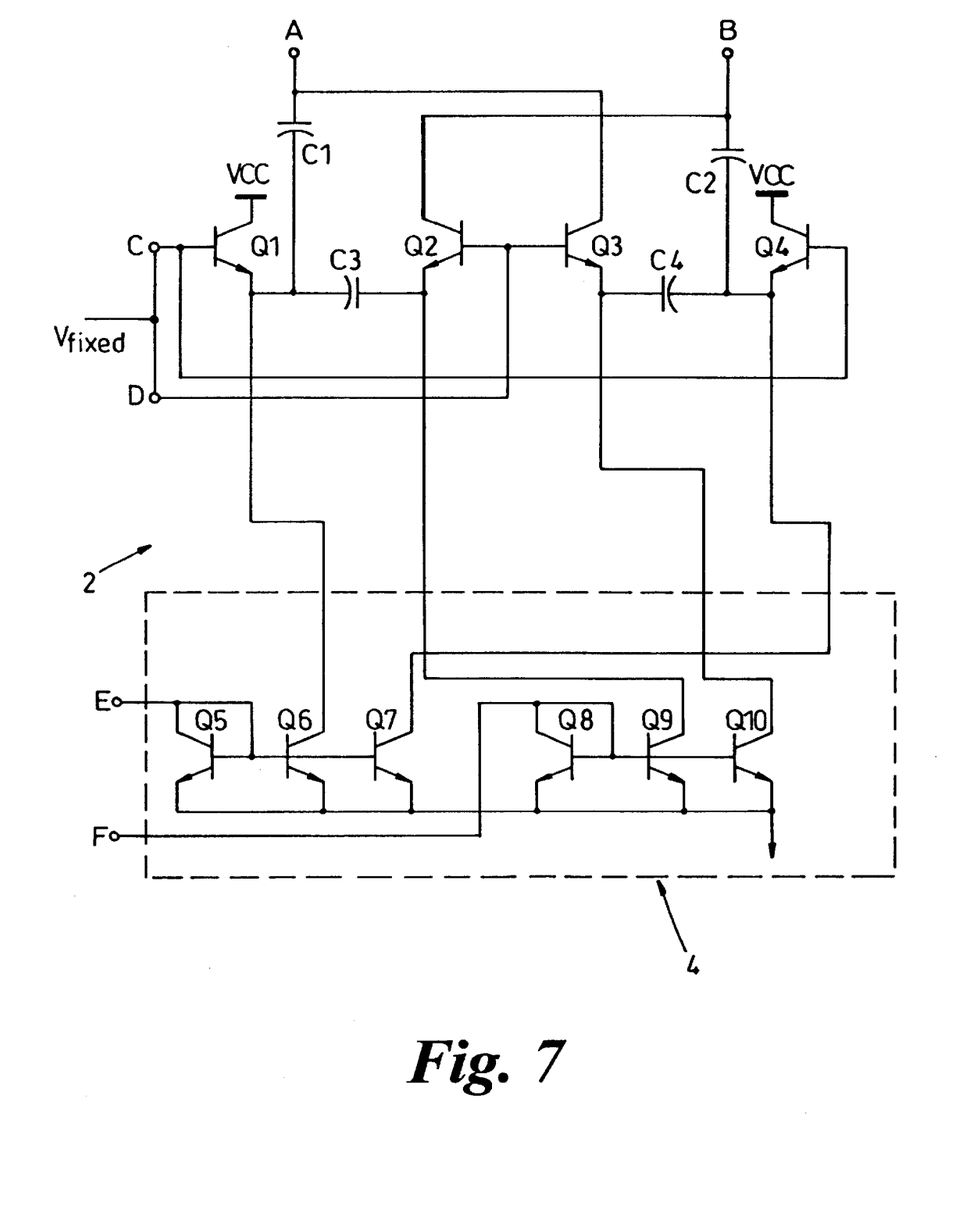
FIG. 7 is a sixth preferred embodiment variable capacitance circuit using current control.

FIG. 7 shows a further preferred embodiment of the invention in which the variable capacitance circuit 2 is current controlled rather than voltage controlled. In this embodiment a fixed DC voltage bias is applied to both ports C and D and control of the circuit 2 is effected by applying differential currents to ports E and F.

The preferred variable capacitance circuit 2 comprises: four transistors Q1, Q2, Q3, Q4; two fixed capacitors C1 and C2; two bypass capacitors C3 and C4; and a differential current mirror 4 comprising six transistors Q5-Q10.

Components common with the previous voltage controlled embodiments are interconnected and operate in the same way. The differential current mirror arrangement 4 acts as variable versions of the constant DC current sources/ drains K1, K2, K11–K14 of the voltage controlled embodiments. By varying the DC current flow through the control transistors Q6, Q7, Q9, Q10, the operation of transistors Q1, Q2, Q3, Q4 respectively can be controlled. This allows capacitive current from capacitors C1 and C2 feedback through transistors Q1, Q2, Q3 and Q4 to be varied, and hence, as described above, the capacitance of the circuit 2 between ports A and B to be varied.

Control transistors Q5, Q6 and Q7 form a first port of the differential current mirror which controls transistors Q1 and Q4. The current flowing through port E and transistor Q5 is mirrored through transistors Q6 and Q7 such that by varying the current flowing through port E, transistors Q1 and Q4 can be controlled to influence circuit capacitance as previously described. Similarly, control transistors Q8, Q9 and Q10 control transistors Q2 and Q3, the current flowing through port F and transistor Q8 being mirrored through transistors Q9 and Q10. By varying the current flowing through port F, transistors Q2 and Q3 can be controlled to varying capacitive current feedback as previously described.

FIG. 8 shows a known voltage controlled oscillator (VCO) 30 incorporating a variable capacitance circuit 2 of the invention. The VCO also contains transistors Q, inductors L, and constant current sources K connected as shown. The capacitance C connected in parallel across the variable capacitance circuit 2 adds to the capacitance provided by this circuit 2, as in practice the VCO will only be required to vary its frequency output over a limited range.

The input In of the circuit 2 corresponds to ports C and D in previous figures and is varied in order to vary the effective capacitance 2' of the circuit 2 which in turn varies the frequency of oscillation of the VCO 30 in known manner. The VCO may be implemented as a standalone integrated circuit or incorporated within a larger circuit arrangement.

FIG. 9 shows a VCO 30 incorporating a variable capacitance circuit 2 of the invention, which forms part of the carrier frequency generation and modulation stage of a wireless transmitter. The VCO 30 is connected in a phase lock loop circuit (PLL) 31 as is known, the PLL also comprising a loop filter 32, a charge pump 33, a phase detector 34, and a frequency divider 35. The frequency output of the VCO 30 is effectively locked by this circuit but can be changed by varying a reference signal in the PLL 31. This signal is then modulated with an information signal (I and Q) which is then transmitted by the wireless transmitter. The use of a variable capacitance circuit 2 of the invention provides a low noise and well defined and controllable carrier frequency signal.

While the variable capacitance circuits 2 have been described as being used in combination with tuned circuit oscillators, they could also be applied to filters which use LC networks, and any other application in which a high frequency variable capacitance is required.

The foregoing describes the invention including the preferred forms thereof. Alterations and modifications as would be obvious to some one skilled in the art are intended to be incorporated within the scope hereof.

What is claimed is:

1. A variable AC capacitance circuit comprising:
   a first and a second transistor means having a bypass capacitor connected therebetween;
   a fixed capacitor connected between a first AC port and said bypass capacitor;
   wherein said second transistor means is connected between said bypass capacitor and a second AC port;
   the circuit arranged such that AC current flowing through said fixed capacitor is divided through said first and second transistor means, wherein the proportion of AC current flowing through each said means is varied in order to vary the net AG current flowing between said first and said second AC ports; and
   wherein the voltage difference between the bases of said first and second transistor means is varied in order to vary the proportion of AC current flowing through each said transistor means.

2. A variable AC capacitance circuit as claimed in claim 1, wherein said fixed capacitor is connected across said first transistor means such that current flowing therethrough at least partially cancels AC current flowing through said fixed capacitor.

3. A variable capacitance circuit as claimed in claim 2, wherein said first and second transistor means comprise:
   a first and second transistor respectively having first and second emitters respectively and wherein said bypass capacitor is connected between said emitters;
   said second transistor having a collector connected to said second AC port; and
   a first and second DC current source connected to said first and second emitters respectively;
   wherein the voltage difference between the bases of said first and second transistors is varied in order to vary the proportion of AC current flowing through each said transistor.

4. A variable capacitance circuit as claimed in claim 3, wherein a degeneration resistor is connected in parallel with said bypass capacitor between the emitters of said first and second transistor.

5. A variable capacitance circuit as claimed in claim 1, wherein the first and second DC current sources comprise a differential current mirror.

6. A variable AC capacitance circuit comprising:
   a first and a second AC current control means connected together;
   a first fixed capacitor connected between a first AC port and said first and second means connection;
   wherein said second means is connected between said capacitor and a second AC port;
   a third and a fourth AC current control means connected together;
   a second fixed capacitor connected between said second AC port and said third and fourth means connection;
   wherein said third means is connected between said second fixed capacitor and said first AC port;
   the circuit arranged such that part of the AC current flowing through said first fixed capacitor AC port is divided through said first and second means and such that AC current flowing through said second fixed capacitor is divided through said third and fourth means, and wherein the proportion of AC current flowing through each said means is varied in order to vary the net AC current flowing between said first and second AC ports.

7. A variable capacitance AC circuit as claimed in claim 6, wherein control of said first and fourth means is ganged together and wherein control of said second and third means is ganged together.

8. A variable AC capacitance circuit as claimed in claim 7, wherein said first fixed capacitor is connected across said first AC current control means such that current flowing therethrough at least partially cancels AC current flowing through said first fixed capacitor; and wherein said second fixed capacitor is connected across said fourth AC current control means such that current flowing therethrough at least partially cancels AC current flowing through said second fixed capacitor.

9. A variable capacitance circuit as claimed in claim 8, wherein said first and second AC current control means comprise:
   a first and second transistor respectively having emitters connected together;
   said second transistor having a collector connected to said second AC port; and
   a DC current source connected to said emitter connection;
   wherein the voltage difference between the bases of said first and second transistors is varied in order to vary the proportion of AC current flowing through each said transistor;
   and wherein said third and fourth AC current control means comprise:
   a third and fourth transistor respectively having emitters connected together;
   said third transistor having a collector connected to said first AC port; and
   a DC current source connected to said emitter connection;
   wherein the voltage difference between the bases of said third and fourth transistors is varied in order to vary the proportion of AC current flowing through each said transistor.

10. A variable capacitance circuit as claimed in claim 8, wherein said first and second AC current control means comprise:
    a first and second transistor respectively;
    said second transistor having a collector connected to said second AC port;
    a degeneration resistor and a bypass capacitor connected in parallel between the emitter of said first and second transistor;
    a first and a second DC current source connected respectively to the emitters of said first and second transistor;
    wherein the voltage difference between the bases of said first and second transistors is varied in order to vary the proportion of AC current flowing through each said transistor;
    and wherein said third and fourth AC current control means comprise:
    a third and fourth transistor respectively;
    said third transistor having a collector connected to said first AC port;
    a degeneration resistor and a bypass capacitor connected in parallel between the emitter of said third and fourth transistor;
    a third and a fourth DC current source connected respectively to the emitters of said third and fourth transistor;

wherein the voltage difference between the bases of said third and fourth transistors is varied in order to vary the proportion of AC current flowing through each said transistor.

11. A variable capacitance circuit as claimed in claim 8, wherein said first and second AC current control means comprise:
  a first and second transistor respectively;
  said second transistor having a collector connected to said second AC port and a bypass capacitor connected between the emitter of said first and second transistor;
  a first and a second DC current source connected respectively to the emitters of said first and second transistor;
  wherein the first and second DC current sources or drains are varied in order to vary the proportion of AC current flowing through each said transistor;
  and wherein said third and fourth AC current control means comprise:
    a third and fourth transistor respectively;
    said third transistor having a collector connected to said first AC port and a bypass capacitor connected between the emitter of said third and fourth transistor;
    a third and a fourth DC current source connected respectively to the emitters of said third and fourth transistor;
    wherein the third and fourth DC current sources are varied in order to vary the proportion of AC current flowing through each said transistor.

12. A variable capacitance circuit as claimed in claim 11, wherein the first and second DC current sources and the third and fourth DC current sources comprise differential current mirrors.

13. A voltage controlled oscillator comprising the variable capacitance circuit of claim 1.

14. A voltage controlled oscillator comprising the variable capacitance circuit of claim 6.

15. A variable AC capacitance circuit comprising:
  a first and a second AC current control means having a first bypass capacitor connected therebetween;
  a first fixed capacitor connected between a first AC port and said first bypass capacitor; wherein said second means is connected between said first bypass capacitor and a second AC port;
  a third and a fourth AC current control means having a second bypass capacitor connected therebetween;
  a second fixed capacitor connected between said second AC port and said second bypass capacitor;
  wherein said third means is connected between said second fixed capacitor and said first AC port;
  the circuit arranged such that part of the AC current flowing through said first fixed capacitor AC port is divided through said first and second means and such that AC current flowing through said second fixed capacitor is divided through said third and fourth means, and wherein the proportion of AC current flowing through each said means is varied in order to vary the net AC current flowing between said first and second AC ports.

16. A variable capacitance AC circuit as claimed in claim 15, wherein control of said first and fourth means is ganged together and wherein control of said second and third means is ganged together.

17. A variable AC capacitance circuit as claimed in claim 16, wherein said first fixed capacitor is connected across said first AC current control means such that current flowing therethrough at least partially cancels AC current flowing through said first fixed capacitor; and wherein said second fixed capacitor is connected across said fourth AC current control means such that current flowing therethrough at least partially cancels AC current flowing through said second fixed capacitor.

18. A variable capacitance circuit as claimed in claim 17, wherein said first and second AC current control means comprise:
  a first and second transistor respectively having first and second emitters respectively and wherein said first bypass capacitor is connected between said emitters;
  said second transistor having a collector connected to said second AC port; and
  a first and second DC current source connected to said first and second emitters respectively;
  wherein the voltage difference between the bases of said first and second transistors is varied in order to vary the proportion of AC current flowing through each said transistor;
  and wherein said third and fourth AC current control means comprise:
    a third and fourth transistor respectively having third and fourth emitters respectively and wherein said second bypass capacitor is connected between said emitters;
    said third transistor having a collector connected to said first AC port; and
    a third and fourth DC current source connected to said third and fourth emitters respectively;
    wherein the voltage difference between the bases of said third and fourth transistors is varied in order to vary the proportion of AC current flowing through each said transistor.

19. A variable capacitance circuit as claimed in claim 17, wherein said first and second AC current control means comprise:
  a first and second transistor respectively;
  said second transistor having a collector connected to said second AC port;
  a first degeneration resistor connected in parallel with said first bypass capacitor between the emitters of said first and second transistor;
  a first and a second DC current source connected respectively to the emitters of said first and second transistor;
  wherein the voltage difference between the bases of said first and second transistors is varied in order to vary the proportion of AC current flowing through each said transistor;
  and wherein said third and fourth AC current control means comprise:
    a third and fourth transistor respectively;
    said third transistor having a collector connected to said first AC port;
    a second degeneration resistor connected in parallel with said second bypass capacitor between the emitters of said third and fourth transistor;
    a third and a fourth DC current source connected respectively to the emitters of said third and fourth transistor;
    wherein the voltage difference between the bases of said third and fourth transistors is varied in order to vary the proportion of AC current flowing through each said transistor.

20. A variable capacitance circuit as claimed in claim 19, wherein the first and second DC current sources and the third and fourth DC current sources comprise differential current mirrors.

21. A variable capacitance circuit comprising:

a first and a second transistor means having a bypass capacitor connected therebetween;

a fixed capacitor connected between a first AC port and said bypass capacitor;

wherein said second transistor means is connected between said bypass capacitor and a second AC port;

a first and a second DC current source connected respectively to said first and second transistor means;

the circuit arranged such that AC current flowing through said fixed capacitor is divided through said first and second means, and wherein the proportion of AC current flowing through each said means is varied in order to vary the net AC current flowing between said first and said second AC ports;

and wherein the first and second DC current sources are varied in order to vary the proportion of AC current flowing through each said transistor means.

* * * * *